United States Patent
Lee et al.

(10) Patent No.: US 8,072,512 B2
(45) Date of Patent: Dec. 6, 2011

(54) SIGNAL GENERATOR AND METHOD FOR GENERATING SIGNALS FOR REDUCING NOISE IN SIGNALS

(75) Inventors: Myoung-Su Lee, Seoul (KR); June-Soo Han, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/801,942

(22) Filed: Jul. 2, 2010

(65) Prior Publication Data

US 2010/0271247 A1 Oct. 28, 2010

Related U.S. Application Data

(63) Continuation of application No. 11/524,436, filed on Sep. 21, 2006, now abandoned.

(30) Foreign Application Priority Data

Dec. 8, 2005 (KR) .......................... 10-2005-0119815

(51) Int. Cl.
*H04N 5/217* (2006.01)
*H04N 9/64* (2006.01)
(52) U.S. Cl. ....................................... 348/241; 348/243
(58) Field of Classification Search .................. 348/243
See application file for complete search history.

(56) References Cited

U.S. PATENT DOCUMENTS

| | | | |
|---|---|---|---|
| 5,982,318 A | 11/1999 | Yiannoulos | |
| 6,476,864 B1 | 11/2002 | Borg et al. | |
| 6,529,237 B1 * | 3/2003 | Tsay et al. | 348/241 |
| 6,587,143 B1 * | 7/2003 | Boisvert | 348/241 |
| 6,829,007 B1 | 12/2004 | Bilhan et al. | |
| 7,242,820 B2 * | 7/2007 | Nam | 382/312 |
| 7,282,685 B2 | 10/2007 | Boemler | |
| 7,286,170 B2 | 10/2007 | Inui et al. | |
| 7,385,636 B2 * | 6/2008 | Xu | 348/241 |
| 7,405,546 B2 | 7/2008 | Amrani et al. | |
| 7,408,577 B2 | 8/2008 | Nakamura et al. | |
| 7,715,661 B2 * | 5/2010 | Yasui et al. | 382/312 |
| RE41,767 E * | 9/2010 | Lee | 341/155 |
| 2003/0146369 A1 | 8/2003 | Kokubu | |
| 2003/0202111 A1 * | 10/2003 | Park | 348/243 |
| 2003/0214597 A1 | 11/2003 | Nam | |
| 2005/0168601 A1 | 8/2005 | Lim | |
| 2005/0243194 A1 | 11/2005 | Xu | |
| 2006/0001750 A1 | 1/2006 | Mizuguchi et al. | |
| 2006/0181337 A1 | 8/2006 | Dreps et al. | |
| 2007/0132868 A1 | 6/2007 | Lee et al. | |

FOREIGN PATENT DOCUMENTS

| | | | |
|---|---|---|---|
| JP | 11-355670 A | | 12/1999 |
| JP | 2003-234962 A | | 8/2003 |
| JP | 2004-153682 A | | 5/2004 |
| KR | 10-2007-0060437 A | | 6/2007 |
| WO | WO 2006/083490 A2 | | 8/2006 |
| WO | WO 2006/083490 A3 | | 8/2006 |

* cited by examiner

*Primary Examiner* — Ngoc-Yen Vu
(74) *Attorney, Agent, or Firm* — Lee & Morse, P.C.

(57) ABSTRACT

A CMOS image sensor may include an active pixel sensor array and a noise canceller array corresponding to the active pixel sensor array. A method of operating such an CMOS image sensor may involve generating a varying reference signal that mirrors noise external to the active pixel sensor array, outputting the varying reference signal to the noise canceller array, and using the varying reference signal in the noise canceller array to cancel noise both internal to and external to the active pixel sensor array.

14 Claims, 9 Drawing Sheets

SIGNAL GENERATOR AND METHOD FOR GENERATING SIGNALS FOR REDUCING NOISE IN SIGNALS

CROSS REFERENCE TO RELATED APPLICATION

This is a continuation application based on application Ser. No. 11/524,436 filed Sep. 21, 2006 now abandoned, the entire contents of which is hereby incorporated by reference.

BACKGROUND OF THE INVENTION

1. Field of the Invention

The invention relates to signal generators and methods for generating signals, which may be employed by image sensors. More particularly, one or more aspects of the invention relate to complimentary metal oxide semiconductor (CMOS) image sensors and methods of operating CMOS image sensors having improved noise reduction and/or elimination properties and improved image quality.

2. Description of the Related Art

Image sensors may be employed in various fields, e.g., robotics, transportation, automobiles, satellite-based instrumentation, navigation, etc. Image sensors may include a two-dimensional array of pixels formed on a semiconductor substrate, and such a pixel array may correspond to an image field of an image frame.

Image sensors may include a photoelectric conversion element that is capable of accumulating a quantity of electrical charge corresponding to an amount of detected energy, e.g., visible light, etc. For example, each pixel of a pixel array may include such a photoelectric conversion element and when photons impact a surface of the photoelectric conversion element, free charge carriers may be produced. These free charge carriers may then be collected by the respective photoelectric conversion element. The collected charge carriers may then be converted to an output signal, e.g., a voltage or a current, corresponding to the respective quantity of collected free charge carriers. Each of the pixels of the pixel array may output a respective output signal and each of the output signals may be supplied to an output circuit and employed to generate an image corresponding to the amount of detected energy.

Various types of image sensors are known, e.g., charge coupled device (CCD) image sensors and CMOS image sensors. In comparison to CCD image sensors, CMOS image sensors may be advantageous because, e.g., CMOS image sensors may be fabricated using, e.g., standard CMOS processes, may be integrated with other CMOS devices and circuitry on a single chip enabling miniaturization of devices, may employ relatively low operating voltages, and may consume relatively less power. In comparison to CCD image sensors, however, CMOS image sensors generally need to employ a high resolution analog-to-digital converter (ADC) for converting an analog signal received from an active pixel sensor (APS) to a digital signal.

The quality of image(s) produced by an image sensor may be directly related to a signal to noise (S/N) ratio of the image sensor, e.g., the higher the S/N ratio of an image sensor, the higher the quality, e.g., resolution, of images produced by that image sensor. In an attempt to reduce noise and increase the S/N ratio, CMOS image sensors may employ, e.g., ADCs that perform correlated double sampling (CDS). Such an ADC that also performs CDS may reduce noise characteristics corresponding to aspects of the ADC itself. However, such ADCs that perform CDS may not reduce and/or eliminate other types of noise, e.g., power supply noise generated by a portion(s) of the respective pixel other than the respective ADC.

Demand for image sensors capable of producing higher resolution images is increasing. One reason such demand is increasing is that as chip sizes are decreasing, the negative impact of noise on image quality increases. Therefore, designs and/or structures for image sensors having improved noise reduction and improved image quality are desired.

SUMMARY OF THE INVENTION

One or more aspects of the invention is therefore directed to signal generators and methods for generating signals, which may be employable by image sensors and which substantially overcome one or more of the problems due to the limitations and disadvantages of the related art.

It is therefore a feature of an embodiment of the present invention to provide CMOS image sensors and methods of operating CMOS image sensors having improved noise reduction and/or elimination properties and improved image quality.

It is therefore a separate feature of embodiments of the present invention to reduce and/or eliminate power supply noise in a CMOS image sensor.

It is therefore a separate feature of embodiments of the present invention to reduce and/or eliminate switching noise in a CMOS image sensor.

It is therefore a separate feature of embodiments of the present invention to reduce and/or eliminate switching noise and power supply noise in a CMOS image sensor.

It is therefore a separate feature of embodiments of the present invention to provide an apparatus and a method for reducing switching and power supply noise employable with and/or using elements of known CMOS image sensors.

At least one of the above and other features and advantages of the present invention may be realized by providing a method for operating a CMOS image sensor including an active pixel sensor array and a noise canceller array corresponding to the active pixel sensor array, the method involving generating a varying reference signal that mirrors noise external to the active pixel sensor array, outputting the varying reference signal to the noise canceller array, and using the varying reference signal in the noise canceller array to cancel noise both internal to and external to the active pixel sensor array.

Generating the varying reference signal may involve mirroring noise in a power supply supplying power to the active pixel sensor array. Mirroring noise in the power supply may involve creating a replicated signal in accordance with pixel functioning of a pixel in the active pixel sensor array and power from the power supply. Generating the varying reference signal may involve adding the replicated signal to a constant reference signal. Creating the replicated signal may involve providing an optical black pixel having a pixel structure equivalent to that of the pixel in the active pixel sensor array and supplying power from the power supply to the optical black pixel.

Creating the replicated signal may involve providing an equivalent circuit having a response to input power equal to that of the pixel in the active pixel sensor array and supplying power from the power supply to the equivalent circuit. Generating the varying reference signal may involve mirroring switching offset noise within the noise canceller array. Generating the varying reference signal may involve supplying the replicated signal to a dummy noise canceller having an equivalent structure to that of a noise canceller of the noise canceller array. Generating the varying reference signal may involve mirroring switching offset noise within the noise canceller array. Generating the varying reference signal may involve supplying a constant reference signal to a dummy noise canceller having an equivalent structure to that of a noise canceller of the noise canceller array.

At least one of the above and other features and advantages of the present invention may be separately realized by providing an apparatus for use with a CMOS image sensor including an active pixel sensor array and a noise canceller array corresponding to the active pixel sensor array, the apparatus including a varying reference signal generator to generate a varying reference signal that mirrors noise external to the active pixel sensor array and to output the varying reference signal to the noise canceller array.

The varying reference signal may mirror noise in a power supply supplying power to the active pixel sensor array. The apparatus may include a replication unit for creating a replicated signal in accordance with pixel function of a pixel in the active pixel sensor array and power from the power supply. The varying reference signal generator may include a comparator for adding the replicated signal and a constant reference signal. The replication unit may include an optical black pixel having a pixel structure equivalent to that of the pixel in the active pixel sensor array, the optical black pixel receiving power from the power supply. The replication unit may include an equivalent circuit having a response to input power equal to that of the pixel in the active pixel sensor array, the equivalent circuit receiving power from the power supply.

The varying reference signal may mirror switching offset noise within the noise canceller array. The varying reference signal generator may include a dummy noise canceller having an equivalent structure to that of a noise canceller of the noise canceller array, the dummy noise canceller may receive the replicated signal. The varying reference signal may mirror switching offset noise within the noise canceller array. The varying reference signal generator may include a dummy noise canceller having an equivalent structure to that of a noise canceller of the noise canceller array. The varying reference signal generator may include a plurality of dummy noise cancellers.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
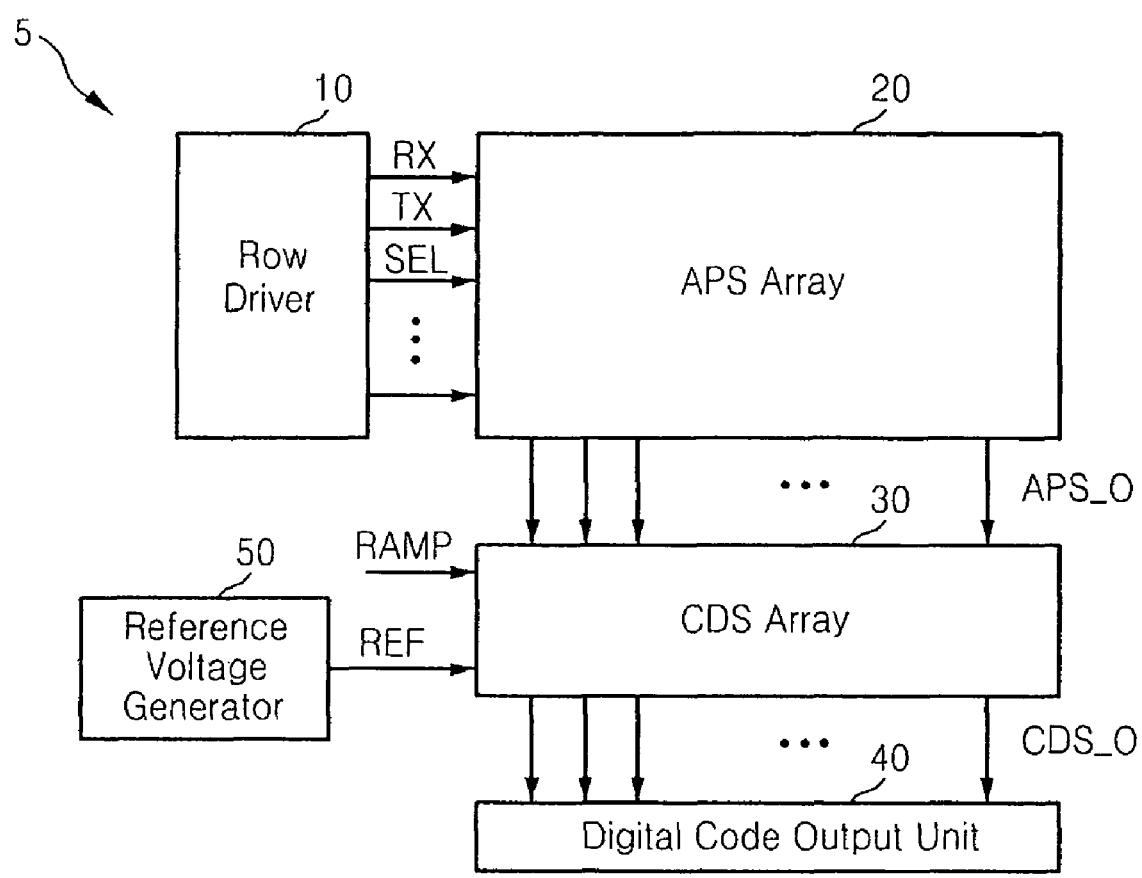
FIG. 1 illustrates a general block diagram of an exemplary CMOS image sensor employable with one or more aspects of the invention.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the above description of exemplary embodiments, terms "low" and "high" respectively refer to logically opposite signal values or levels, e.g., logical values of "0" and "1", respectively. The terms "low" and "high" do not correspond to any particular voltage level. Like reference numerals refer to like elements throughout.

Figure 2:
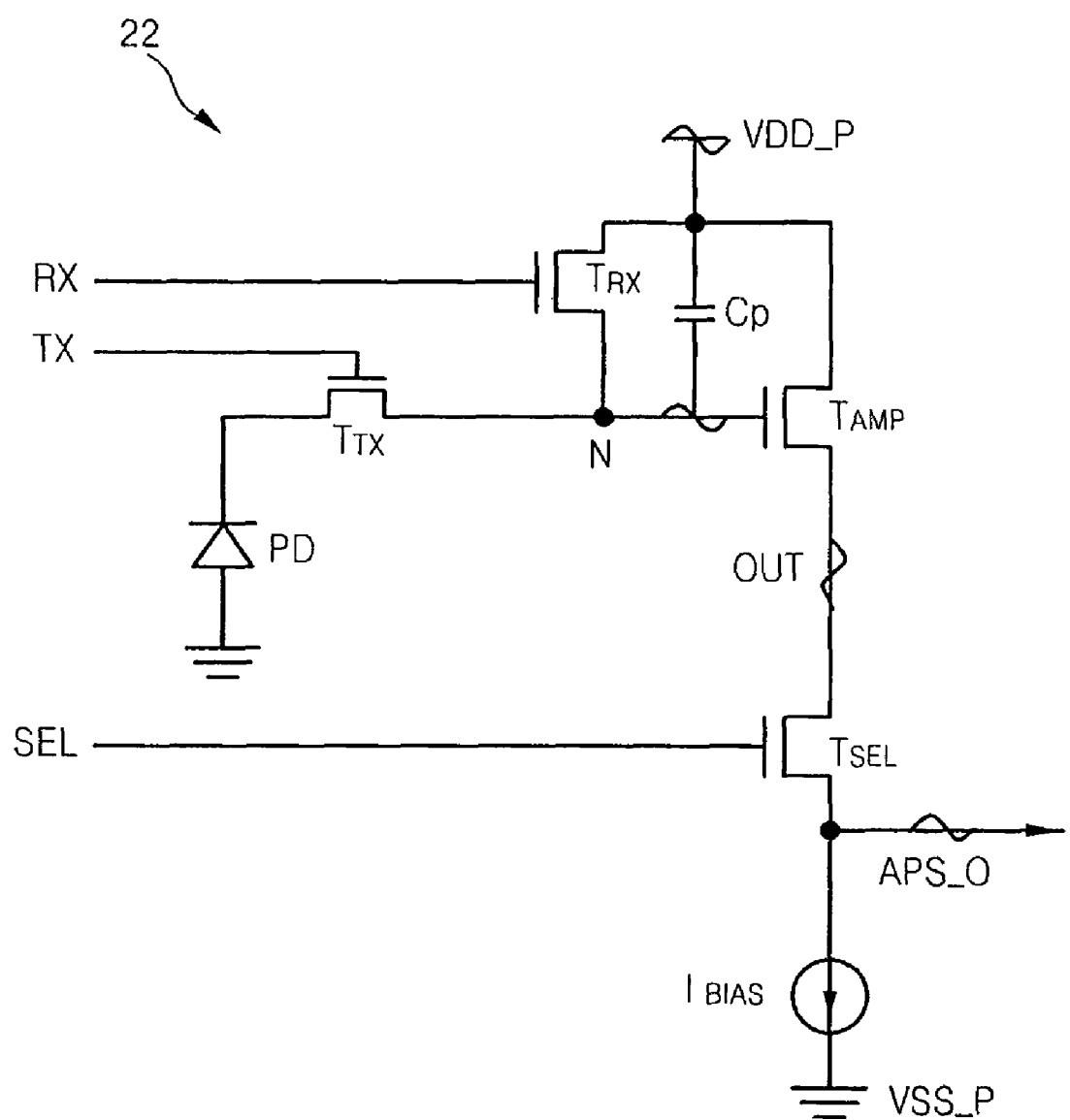
FIG. 2 illustrates a schematic diagram of an exemplary pixel of a CMOS image sensor employable with one or more aspects of the invention.

FIG. 1 illustrates a general block diagram of an exemplary CMOS image sensor employable with one or more aspects of the invention and FIG. 2 illustrates a schematic diagram of an exemplary pixel 22 of a CMOS image sensor employable with one or more aspects of the invention.

As shown in FIG. 1, a CMOS image sensor 5 may include a row driver 10, an APS (active pixel sensor) array 20, a CDS (correlated double sampling) array 30, a digital code output unit 40 and a reference voltage generator 50.

The row driver 10 may receive a timing signal and/or one or more control signals from a controller (not shown), and may supply a plurality of driving signals to the APS array 20. The driving signals may control a read-out operation, i.e., reading of the charge absorbed, of pixels of the APS array 20. The driving signals may include, e.g., a reset signal RX, a transfer signal TX and/or a pixel selection signal SEL. In embodiments of the invention, the driving signals may be supplied to the APS array 20 in a row-wise manner, such that, e.g., driving signals corresponding to respective rows of the APS array 20 may be sequentially supplied.

The APS array 20 may include a plurality of pixels 22, each of which may have the exemplary structure illustrated in FIG. 2. The pixels 22 may be arranged in a row-by-column matrix and may include, e.g., n rows and m columns such that the APS array may include n×m pixels 22, where n and m are both integers. Each of the pixels 22 may absorb light reflected from an object in an image frame and may convert the absorbed light energy into an electrical signal. As discussed above, the APS array 20 may receive a plurality of driving signals from the row driver 10. Electrical signals produced by each of the pixels 22 of the APS array 20 may be supplied to the CDS array 30.

As shown in FIG. 2, each of the pixels 22 may include a photoelectric conversion element PD, reset element $T_{RX}$, a transfer element $T_{TX}$, a charge detection element N, an amplifying unit $T_{AMP}$, and a selection element $T_{SEL}$.

The photoelectric conversion element PD may be, e.g., a photodiode, a phototransistor, a photogate, a Pinned Photo Diode (PPD), etc. The photoelectric conversion element PD may collect charge generated by absorbing light reflected from an object.

The transfer element $T_{TX}$ may be, e.g., a switch or a transistor for transferring charge collected by the photoelectric conversion element PD to the charge detection element N. The transfer element $T_{TX}$ may include, e.g., one or more transistors. In the illustrated example, the transfer element $T_{TX}$ may be controlled by the transfer signal TX.

The reset element $T_{RX}$ may be, e.g., a switch or a transistor for transferring the reset signal RX. In the illustrated example, the reset element $T_{RX}$ may be controlled by the reset signal RX. The reset element $T_{RX}$ may periodically reset the charge detection element N. As shown in the illustrated example, the reset element $T_{RX}$ may have a drain connected to an external power source VDD_P.

The charge detection element N may be, e.g., a floating diffusion (FD) region. The charge detection element N may correspond to an electrical node between the transfer element $T_{TX}$ and the amplifying unit $T_{AMP}$, and may respectively receive the charge collected by the photoelectric conversion element PD via the transfer element $T_{TX}$. As shown in the exemplary pixel structure shown in FIG. 2, the charge detection element N may be connected to a source of the reset element $T_{RX}$, a gate of the amplifying unit $T_{AMP}$, and/or the transfer element $T_{TX}$. The charge detection element may have a parasitic capacitance, whereby charges may be cumulatively collected. In the exemplary pixel structure show in FIG. 2, a capacitor Cp is shown, which may correspond to a parasitic capacitance and not a discrete additional component.

The amplifier $T_{AMP}$ may be, e.g., a source follower amplifier in combination with a constant current generator (not shown), which may be external to the pixel 22. The amplifier $T_{AMP}$ may output an output signal OUT, which may be, e.g., a variable voltage corresponding to the voltage received by the charge detection element N. As shown in the illustrated example, a source of the amplifier $T_{AMP}$ may be connected to a drain of the selection element $T_{SEL}$ and a drain of the selection element $T_{SEL}$ may be connected to the external power source VDD_P.

The selection element $T_{SEL}$ may enable selection of the respective pixel 22 to be read in a row-wise manner. When the respective pixel 22 is selected by the respective pixel selection signal SEL, the respective pixel 22 may output a pixel output signal APS_O. As shown in the example illustrated in FIG. 2, a gate of the selection element $T_{SEL}$ may receive the respective pixel selection signal SEL, and a source of the selection element $T_{SEL}$ may be connected to a bias current source $I_{BIAS}$, which may be connected to a ground voltage source VSS_P.

Referring back to FIG. 1, a general overview of an operation of the exemplary CMOS image sensor 5 will be provided. The reset signal RX may control a reset operation for the pixels 22 of the APS array 20. For example, a reset signal $RX_k$ corresponding to the k-th row of the APS array 20 may be applied to reset one or more pixels 22 arranged in the k-th row of the APS array 20. The respective reset signals RX may be supplied via corresponding electrical paths (not shown) connecting the row driver 10 the APS 20. The transfer signal TX may control the transfer element $T_{TX}$.

The pixel selection signal SEL may control the selection of pixels 22 in the APS array 20. For example, a pixel selection signal $SEL_k$ corresponding to the k-th row of the APS array 20 may select one or more pixels arranged in the k-th row of the APS array 20. The respective pixel selection signals SEL may be supplied via a corresponding electrical path (not shown) connecting the row driver 10 to the corresponding row of the APS array 20.

During operation of the exemplary CMOS image sensor 5, as discussed above, the n rows of the APS array 20 may be, e.g., sequentially selected based on, e.g., the pixel selection signal SEL, and each of the pixels 22 in, e.g., a selected row of, the APS array 20 may output a respective output signal APS_O to the CDS array 30. For example, in the exemplary APS array 20 with n rows and m columns, as discussed above, during a time period corresponding to the selected one of the n rows of the APS array 20, m respective APS output signals APS_O_1 to APS_O_m may be output to the CDS array 30. Characteristics, e.g. voltage, of an output signal supplied by one of the pixels 22 may change. For example, during a reset signal sampling period, a voltage of the respective APS output signal may correspond to a reset voltage Vres associated with the respective reset signal RX supplied to that pixel 22. Also, e.g., during an image signal sampling period, a voltage of the respective APS output signal being supplied to the CDS array 30, by the same pixel 22, may correspond to an image signal voltage Vsig.

Figure 4:
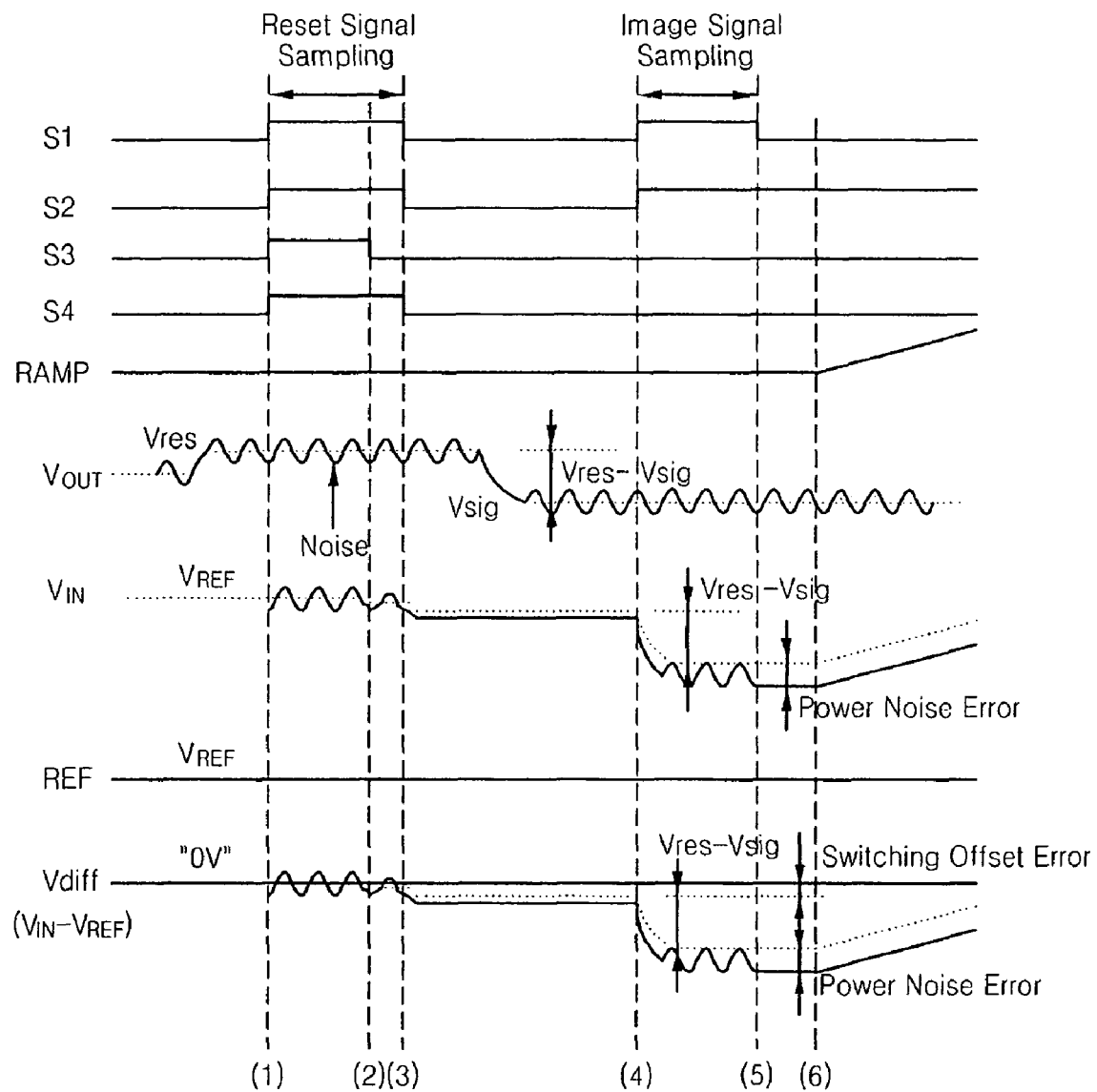
FIG. 4 illustrates a timing diagram of a conventional CMOS image sensor.

Each of the respective APS output signals APS_O_1 to APS_O_m may correspond to a respective output voltage Vout, which may include the reset voltage Vres and the image signal voltage Vsig. As shown in FIG. 4, the reset and image signal voltages Vres, Vsig may be sequentially supplied by the respective pixel 22 of the APS array 20 to the CDS array 30. The CDS array 30 may perform correlated double sampling based on the received voltages, e.g., the respective reset voltage Vres and the respective image signal voltage Vsig.

Figure 3:
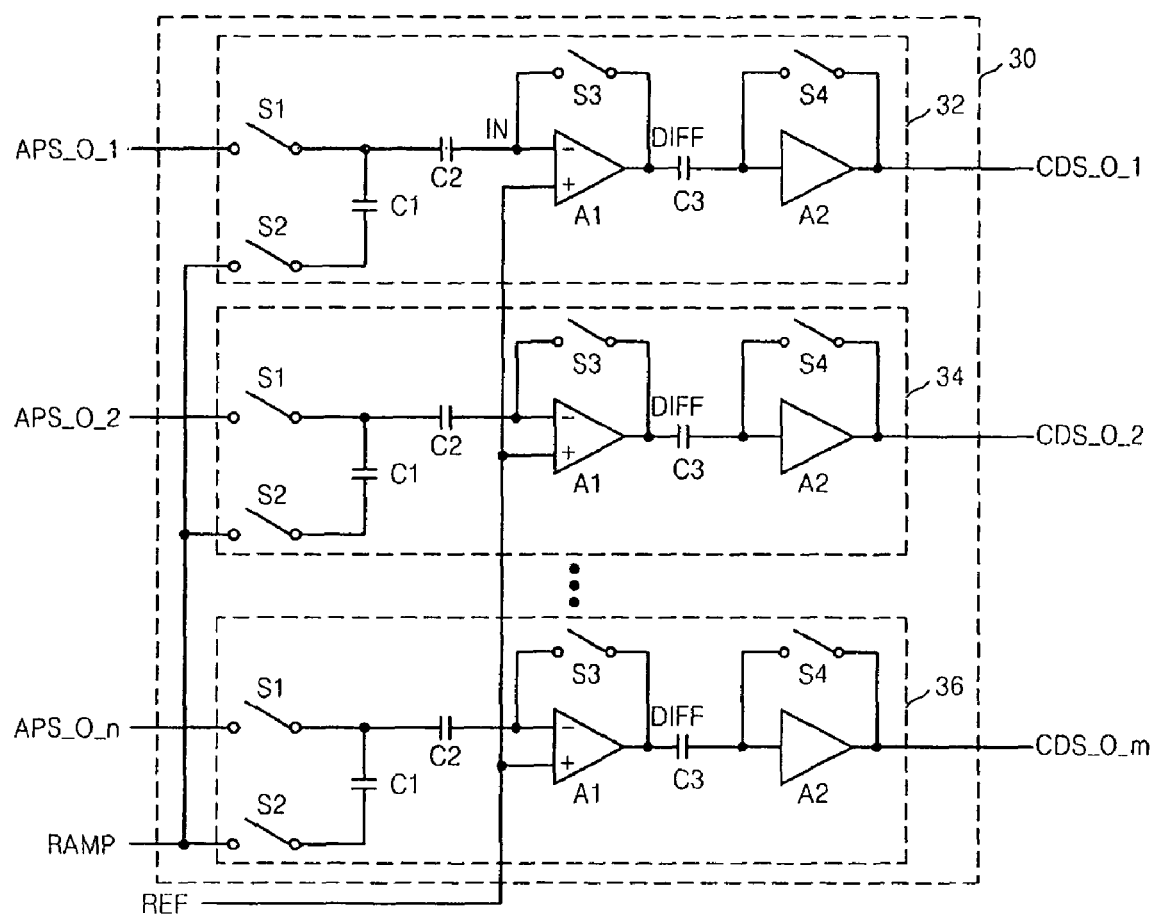
FIG. 3 illustrates a schematic diagram of an exemplary CDS array employable with one or more aspects of the invention.

FIG. 3 illustrates a schematic diagram of an exemplary CDS array 30 employable with one or more aspects of the invention. As shown in FIG. 3, the CDS 30 may include a plurality of CDS circuits 32, 34, 36. Although three CDS circuits 32, 34, 36 are shown, the CDS array 30 may include any number of CDS circuits 32, 34, 36. Each of the CDS circuits 32, 34, 36 may include one or more switches, one or more capacitors, and one or more comparators and/or amplifiers. As shown in the illustrated example, each of the CDS circuits 32, 34, 36 may include four switches, e.g., S1, S2, S3, S4, blocking capacitor C1, a signal storing capacitor C2, a signal transfer capacitor C3, a comparator A1, and an amplifier A2.

The CDS array 30 may include, e.g., m CDS circuits, i.e., one CDS circuit for each of the m columns of the exemplary APS array 20, and each of the m CDS circuits may respectively receive the respective APS output signal APS_O_1 to APS_O_m, including the respective reset voltage Vres and the respective image signal voltage Vsig, and may respectively output a CDS output signal CDS_O_1 to CDS_O_m. Each CDS circuit, e.g., 32, 34, 36 may also receive a reference signal REF and a ramp signal RAMP, e.g., a voltage ramping signal, as shown in FIG. 3.

As shown in FIG. 1, the reference signal REF may be generated and supplied to the CDS array 30 by the reference voltage generator 50. The ramp signal RAMP may be supplied to the CDS array 30 by, e.g., a ramp signal generator (not shown).

As discussed above and as shown in FIG. 3, the respective APS output signal, e.g., APS_O_1 including the respective reset voltage Vres and the respective image signal voltage Vsig, may be supplied to the respective CDS circuit 32, via switch S1 and the ramp signal RAMP may be supplied to the CDS circuit 32 via switch S2. The blocking capacitor C1 may be connected between the switch S1 and the signal storing capacitor C2, and the switch S2. The switch S3 may be connected in parallel with an input terminal IN of the comparator A1 and an output terminal of the comparator A1. The reference signal REF may be supplied to another input terminal of the comparator A1. The signal transfer capacitor C3 may be connected between an output terminal DIFF of the comparator A1 and an input terminal of the amplifier A2. The switch S4 may be connected in parallel with the input terminal of the amplifier A2 and an output terminal of the amplifier A2, which may correspond to the respective one of CDS output signals CDS_O_1 to CDS_O_m.

FIG. 4 illustrates a timing diagram of a conventional CMOS image sensor. For simplicity, the reset signal RX, the transfer signal TX and the pixel selection signal SEL are omitted from the timing diagram illustrated in FIG. 4.

As shown in FIG. 4, during a period when reset signal sampling is performed, i.e., between time (1) and time (3), the respective output voltage Vout may be relatively high. More particularly, during the period when reset signal sampling is performed, a respective reset signal RX associated with the respective pixel 22 may be high, i.e., the reset voltage Vres output by the respective pixel 22 may high. While the reset signal sampling is being performed, the switches S1, S2, S3, S4 may be turned on. In the example illustrated in FIG. 4, the switch S3 is turned off at time (2), and the switches S1, S2, and S4 are turned off at time (3).

Then, as shown in FIG. 4, before an image signal sampling is performed, e.g., between time (3) and time (4), the respective voltage Vout of the APS output signal APS_O_1 to APS_O_m, is reduced from the reset voltage Vres by an image signal voltage Vsig output by the same respective pixel 22 of the APS array 20. During the subsequent image signal sampling period between time (4) and time (5), a voltage at the input terminal of the comparator A1 reflects the drop in voltage of the respective voltage Vout of the respective APS output signal APS_O_1 to APS_O_m. As may be seen from the exemplary timing diagram illustrated in FIG. 4, noise resulting from the power supply, e.g., power supply voltage VDD_P, is included in the respective Vout of the respective APS output signal APS_O_1 to APS_O_m. For example, at time (2) when the switch S3 turns off, is reflected in the respective input voltage Vin being supplied to the comparator A1.

As shown in the timing diagram illustrated in FIG. 4, the reference voltage Vref of the reference signal REF that may be supplied by the reference voltage generator 50 reflects no or a negligible amount of noise.

The impact of noise included in the respective output voltage Vout of the respective APS output signal APS_O_1 to APS_O_m on the resulting signal output by the CDS array 30 may be illustrated by the following relationships.

During reset signal sampling, e.g., from time (1) to time (3), impact of noise on $V_{IN\_1}$, Vref impact of noise on $V_{IN\_1}$, Vref and Vdiff_res may be as follows.

$$V_{IN\_1} = Vref + \Delta V_{S3} + \Delta V_{POWER}$$

$$Vref = Vref$$

$$\therefore Vdiff\_res = V_{IN\_1} - Vref = \Delta V_{S3} + \Delta V_{POWER}$$

As discussed above, at time (3), the switch S3 may turn off and may be a dominant cause of signal noise during the reset signal sampling period.

During image signal sampling, e.g., from time (4) to time (5), impact of noise on $V_{IN\_2}$, Vref and Vdiff_sig may be as follows.

$$V_{IN\_2} = Vref + \Delta V_{S3} + \Delta V_{POWER} - Vsig$$

$$Vref = Vref$$

$$\therefore Vdiff\_sig = V_{IN\_2} - Vref = \Delta V_{S3} + \Delta V_{POWER} - Vsig$$

After image signal sampling, e.g., after time (5), impact of noise on $V_{IN\_3}$, Vref and Vdiff_res_sig may be as follows.

$$V_{IN\_2} = Vref + \Delta V_{S3} + \Delta V_{POWER} - Vsig$$

$$V_{IN\_3} = V_{IN\_2} + V_{RAMP} + \Delta V_{S1}$$

$$= Vref + \Delta V_{S3} + \Delta V_{POWER} - Vsig + V_{RAMP} + \Delta V_{S1}$$

$$Vref = Vref$$

$$\therefore Vdiff\_res\_sig = V_{IN\_3} - Vref$$

$$= \Delta V_{S3} + \Delta V_{POWER} - Vsig + V_{RAMP} + \Delta V_{S1}$$

As discussed above, at time (5), the switch S1 may turn off and may be a dominant cause of signal noise during the image signal sampling period. As can be seen from the last equation reflecting the effect of noise on the Vdiff_res_sig signal, there exists multiple sources of noise $\Delta V_{S3}$, $\Delta V_{POWER}$ and $\Delta V_{S1}$ in addition to components intended to be transferred, e.g., Vsig and $V_{RAMP}$.

As discussed above, CMOS image sensors and methods of operating CMOS image sensors that can reduce and/or eliminate the noise resulting, e.g. from the power supply and/or sources outside of the APS array 20 are desired.

Figure 5:
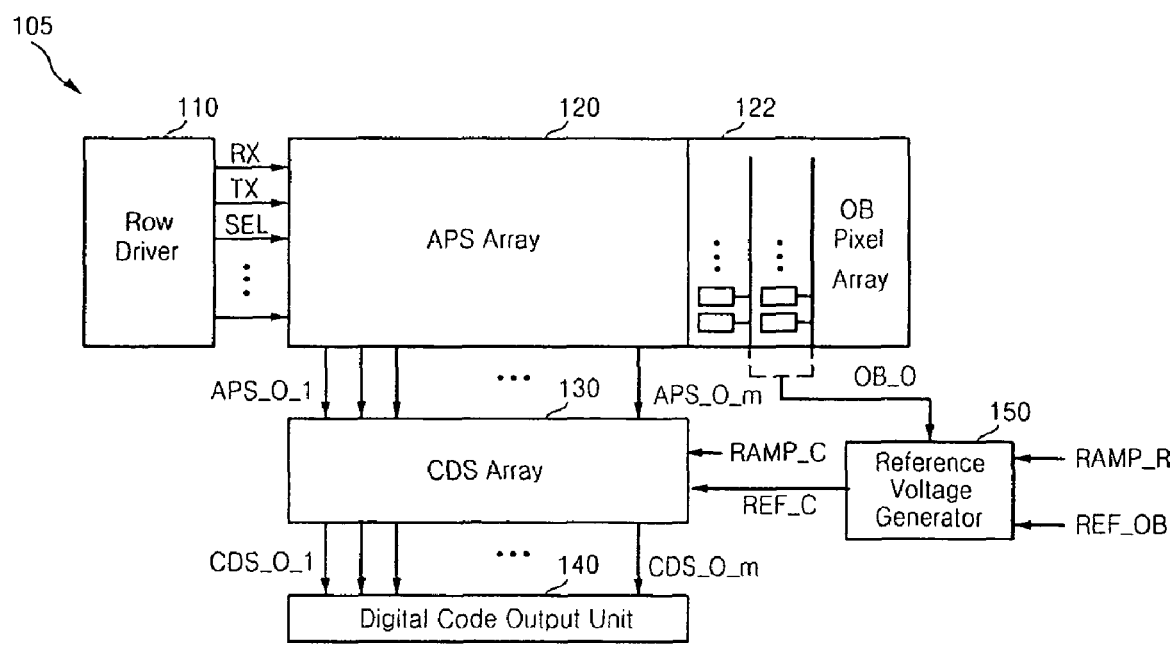
FIG. 5 illustrates a block diagram of a first exemplary embodiment of a CMOS image sensor employing one or more aspects of the invention.

FIG. 5 illustrates a block diagram of a first exemplary embodiment of a CMOS image sensor 105 employing one or more aspects of the invention. For simplicity, only differences between the exemplary embodiment of the CMOS image sensor 105 shown in FIG. 5 and the CMOS image sensor 5 described above in relation to FIGS. 1-3 will be described below.

Similar to the CMOS image sensor 5 described above, the CMOS image sensor 105 may include a row driver 110, an APS array 120, a CDS array 130, a digital code output unit 140. Aspects of the invention may employ a reference voltage generator 150. The CMOS image sensor 105 may also include an optical black (OB) pixel array 122.

The OB pixel array 122 may generally be provided in an image sensor to carry out automatic level compensation (ADLC), i.e., compensate for a pixel's voltage level offset. In embodiments of the invention, the reference voltage generator 150 may employ the OB pixel array 122 to copy the power supply noise and supply the reference voltage generator 150 with an output signal OB_O including noise resulting from, e.g., a power supply, etc., outside of the CDS array 130 of the CMOS image sensor 105.

As illustrated in FIG. 5, in embodiments of the invention, the OB pixel array 122 may include a plurality of OB pixels arranged in one or more columns and one or more rows. In embodiments of the invention, the number of rows of the OB pixel array 122 may correspond to a number of rows of the APS array 120, e.g., the OB pixel array 122 may have n rows. In embodiments of the invention, the OB pixel array 122 may be utilized in a variety of ways. One, some or all of the columns of the OB pixel array 122 may correspond to one of the m columns of the APS array 120 in order to replicate the noise, e.g., the power supply noise.

In embodiments of the invention in which the OB pixel array 122 includes a plurality of columns corresponding to columns of the APS array 120, some or all of the respective output signals OB_O may be connected together as a single signal to the reference voltage generator 150. In other embodiments of the invention of the invention in which the OB pixel array 122 includes a plurality of columns corresponding to columns of the APS array 120, each of the respective output signals OB_O of the plurality of columns of the OB pixel array 122 may be used separately. In other embodiments of the invention of the invention in which the OB pixel array 122 includes a plurality of columns corresponding to columns of the APS array 120, output signals OB_O of the OB pixel array 122 may be separated into groups, and a corresponding number of respective output signals OB_O may be output to the reference voltage generator 150. In embodiments of the invention, each output signal OB_O of each column of the OB pixel array 120 may be based on one, some or all of the OB pixels of the respective column of the OB pixel array 120.

Figure 6:
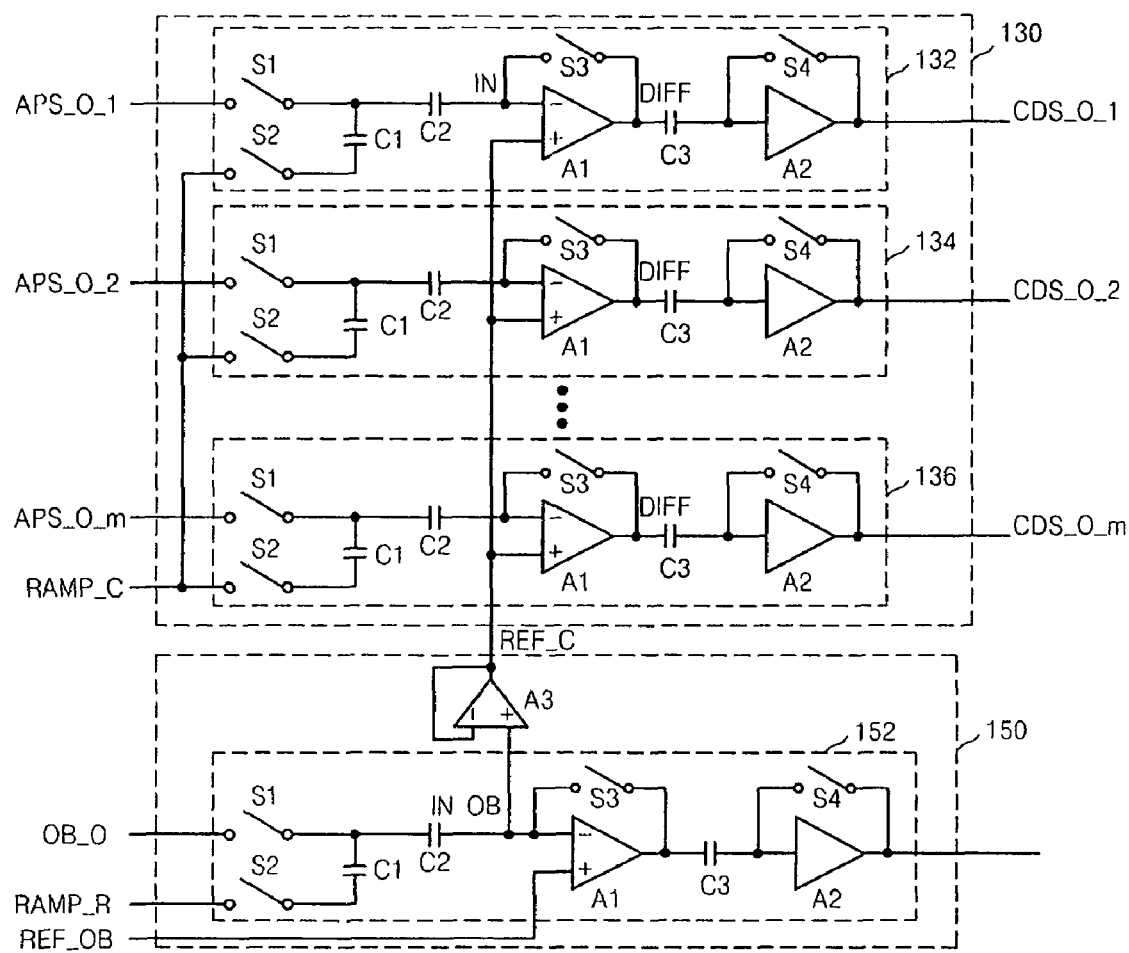
FIG. 6 illustrates a schematic diagram of the exemplary CDS array shown in FIG. 3 being employed according to one or more aspects of the invention with an exemplary reference voltage generator.

As shown in FIG. 5, the exemplary embodiment of the reference voltage generator 150 may receive the output signal OB_O from the OB pixel array 122, a ramp signal RAMP_R, and a REF_OB signal, and may supply a REF_C signal to the CDS array 130 via amplifier A3 (shown in FIG. 6). In embodiments of the invention, the CDS array 130, the APS array 120, the digital code output unit 140, and the row driver 110 may have, e.g., structures corresponding to the CDS array 30, the APS array 20, the digital code output unit 40, and the row driver 10 of the CMOS image sensor shown in FIGS. 1-3.

In embodiments of the invention, a ramp signal generator (not shown) may generate a plurality of ramp signals, e.g. RAMP_R and RAMP_C. As shown in FIG. 5, the RAMP_R signal may be supplied to the reference voltage generator 150 and the RAMP_C signal may be supplied to the CDS array 130. The RAMP_R signal may be supplied to the reference voltage generator 150 and may not have any voltage variation. In embodiments of the invention, the RAMP_R signal supplied to the reference voltage generator 150 may be a substantially constant or completely constant voltage signal, even before, at or after time (6) where the RAMP_C signal may begin increasing.

In embodiments to the invention, the REF_OB signal may correspond to a noise free reference signal generated by, e.g., a known, reference voltage generator, e.g., 50 in FIG. 1.

The REF_C signal may include noise resulting from, e.g., factors outside of the CDS array 130. Such noise factors may be, e.g., power supply noise, clock feed-through noise due to on/off switching operations. In embodiments of the invention, the OB pixel array 122 may be employed by the reference voltage generator 150 to generate a signal having the same or substantially the same noise characteristics as signals of the CMOS image sensor 105 such that the output REF_C signal may cancel all or substantially all of the noise degrading the quality of signals within the CMOS image sensor 105. By supplying a reference voltage signal, e.g., REF_C that includes all or substantially all of the noise degradation affecting the signals within the CMOS image sensor, the effect of noise on image quality may be reduced and/or eliminated.

To reduce and/or eliminate noise that may result from sources external to the CDS array, the reference voltage generator 150 may include a CDS circuit structure that corresponds to CDS circuits in the CDS array 130. In embodiments of the invention, the reference voltage generator 150 may include the same CDS circuit structure as that of the corresponding CDS array 130 and thus, clock feed-through noise due to, e.g., on/off switching operations may be copied to the generated reference voltage signal REF_C.

FIG. 6 illustrates a schematic diagram of the exemplary CDS array 130 shown in FIG. 3 being employed according to one or more aspects of the invention with the exemplary reference voltage generator 150. Only differences between the CDS array 130 illustrated in FIG. 6 and the CDS array 30 illustrated in FIG. 3 will be described below.

As the CDS array 130 illustrated in FIG. 6 corresponds to the CDS array 30 illustrated in FIG. 3, aspects of the invention may be employed with the CDS array 30 illustrated above in FIG. 3. In particular, embodiments of the invention may employ a noise canceling device, e.g., the voltage generator 150, in lieu of, e.g., the voltage generator 50, in addition to, e.g., the voltage generator 50 to cancel noise that may result from factors beyond the CDS array 130. As discussed in relation to FIG. 6, the reference voltage generator 150 may employ the output signal OB_O from the OB pixel array 122, the RAMP_R signal, the REF_OB signal, and a structure 152 corresponding to the structure of a CDS circuit 132, 134, 136, of the corresponding CDS array 130 to generate a reference voltage signal REF_C including noise that substantially or completely corresponds to noise terms resulting from, e.g. power supply and/or clock feed-through, e.g., $\Delta V_{S3}$, $\Delta V_{POWER}$ and $\Delta V_{S1}$, as discussed above.

Figure 7:
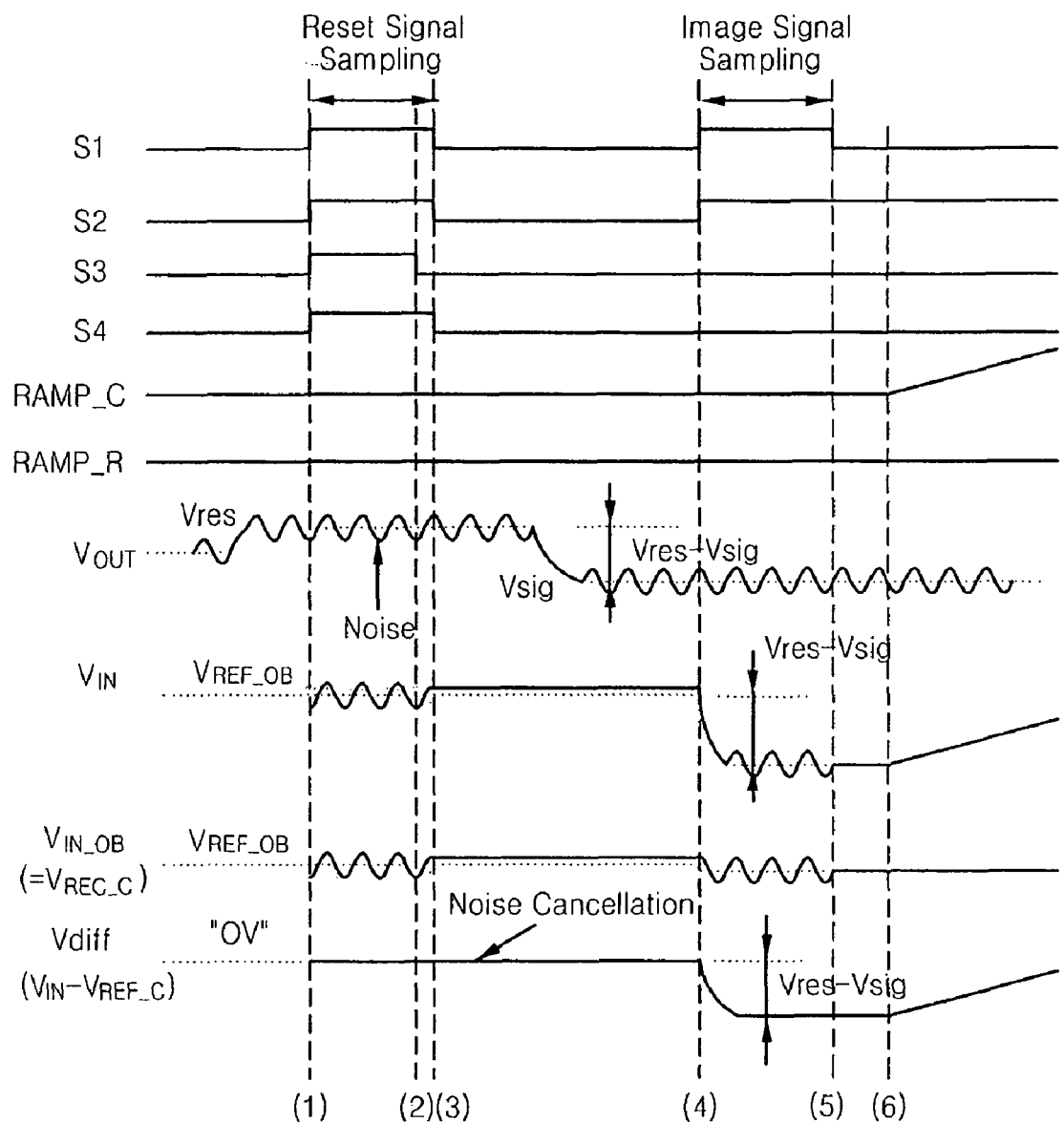
FIG. 7 illustrates an exemplary timing diagram of an exemplary CMOS image employing one or more aspects of the invention.

FIG. 7 illustrates an exemplary timing diagram of an exemplary CMOS image employing one or more aspects of the invention. Operation of the switches S1, S2, S3, S4 may correspond to operation of the switches S1, S2, S3, S4 in the timing diagram shown in FIG. 4. The RAMP_C signal may correspond to the RAMP signal shown in FIG. 4. As shown in FIG. 7, the output voltage Vout signal may substantially or completely correspond to the Vout signal shown in FIG. 4.

As discussed above, in embodiments of the invention, the RAMP_R signal supplied to the reference voltage generator 150 may be a substantially constant or completely constant voltage signal, even before, at or after time (6) where the RAMP_C signal may begin increasing.

Also, as discussed above, in embodiments of the invention, the reference voltage signal REF_C supplied to the CDS array 130 may be generated based on the respective output signal OB_O from the OB pixel array 122, which may copy, e.g, the power supply noise, to the noise free reference voltage REF_OB. Thus, as shown in FIG. 7, in embodiments of the invention, an output signal Vdiff of the comparator A1 may not include, e.g., the power supply noise. More particularly, in embodiments of the invention, the voltage signal Vref_c of the REF_C signal may cancel noise existing in the Vout signal such that the resulting output Vdiff does not include any or substantially all of the noise, e.g., the power supply noise. Thus, embodiments of the invention enable quality of image signals and thus, image quality, may be improved.

More particularly, the noise effect on signals of a CMOS image sensor employing one or more aspects of the invention will be described. The impact of noise included in the respective output voltage Vout of the respective APS output signal APS_O_1 to APS_O_m on the resulting signal output by the CDS array 130 may be illustrated by the following relationships.

During reset signal sampling, e.g., from time (1) to time (3), impact of noise on $V_{IN\_1}$, Vref impact of noise on $V_{IN\_1}$, Vref and Vdiff_res may be as follows.

$$V_{IN\_1} = Vref + \Delta V_{S3} + \Delta V_{POWER}$$

$$V_{IN\_OB\_1} = Vref + \Delta V_{S3} + \Delta V_{POWER}$$

$$\therefore Vdiff\_res = V_{IN\_1} - V_{IN\_OB\_1} = 0$$

As discussed above, at time (3), the switch S3 turns off and is a dominant cause of signal noise during the reset signal sampling period.

During image signal sampling, e.g., from time (4) to time (5), impact of noise on $V_{IN\_2}$, $V_{IN\_OB\_2}$ and Vdiff_sig may be as follows.

$$V_{IN\_2} = V\text{ref} + \Delta V_{S3} + \Delta V_{POWER} - V\text{sig}$$

$$V_{IN\_OB\_2} = V\text{ref} + \Delta V_{S3} + \Delta V_{POWER}$$

$$\therefore V\text{diff\_sig} = V_{IN\_2} - V_{IN\_OB\_2} = -V\text{sig}$$

After image signal sampling, e.g., after time (5), impact of noise on $V_{IN\_OB\_3}$ and Vdiff_res_sig may be as follows.

$$V_{IN\_3} = V_{IN\_2} + V_{RAMP} + \Delta V_{S1}$$
$$= Vref + \Delta V_{S1} + \Delta V_{POWER} - Vsig + V_{RAMP} + \Delta V_{S1}$$
$$V_{IN\_OB\_3} = V_{IN\_OB\_2} + \Delta V_{S1}$$
$$= Vref + \Delta V_{S3} + \Delta V_{POWER} + \Delta V_{S1}$$
$$\therefore \text{Vdiff\_res\_sig} = V_{IN\_3} - V_{IN\_OB\_3}$$
$$= V_{RAMP} + Vsig$$

As discussed above, at time (5), the switch S1 may turn off and may be a dominant cause of signal noise during the image signal sampling period. Thus, in contrast to the CMOS image sensor 5 described above, as can be seen from the last equation reflecting the effect of noise on the Vdiff_res_sig signal, multiple sources of noise, e.g., $\Delta V_{S3}$, $\Delta V_{POWER}$ and $\Delta V_{S1}$ may be canceled and components intended to be transferred, e.g., Vsig and $V_{RAMP}$ may be transferred with no noise or substantially no noise.

Figure 8:
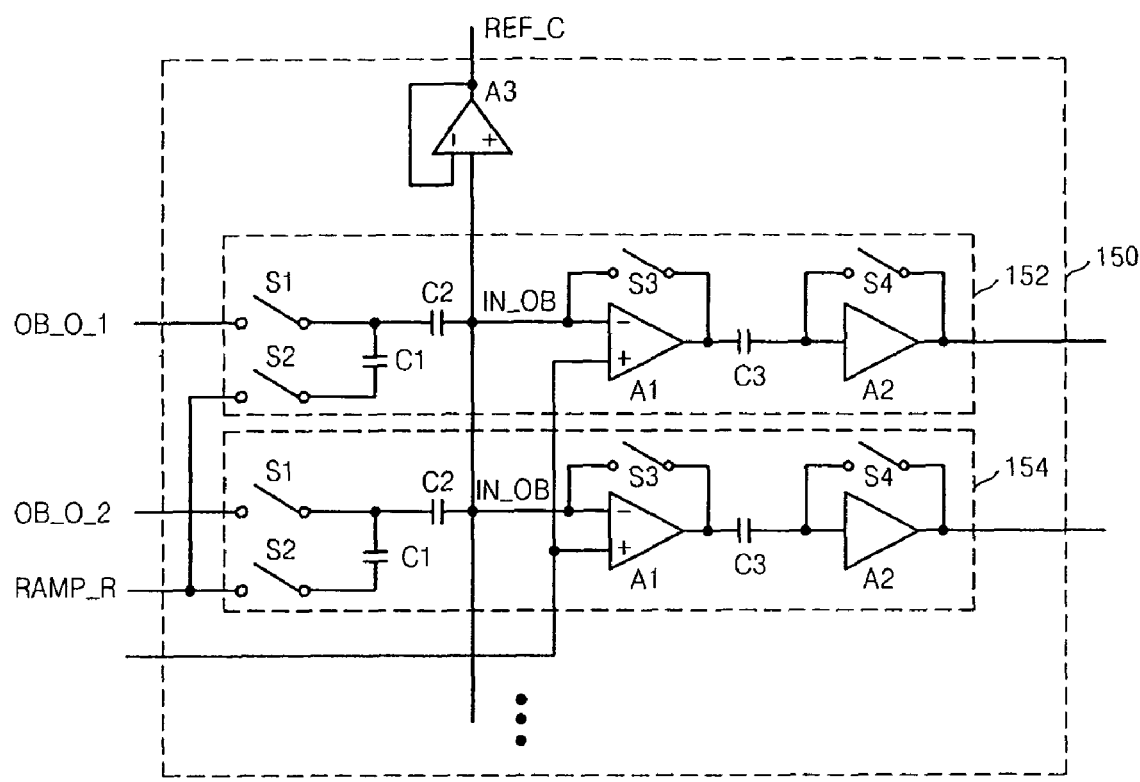
FIG. 8 illustrates another exemplary embodiment of a reference voltage generator, according to one or more aspects of the invention.

FIG. 8 illustrates another exemplary embodiment of a reference voltage generator, according to one or more aspects of the invention. The second embodiment of the reference voltage generator 150' shown in FIG. 8 corresponds to the exemplary embodiment of the reference voltage generator 150 shown in FIG. 1, but includes more than one of the corresponding CDS circuit structures, e.g., 152, 154. Embodiments of the invention may employ a plurality of such corresponding CDS circuit structures, e.g., 152, 154, in an attempt to reduce an effect of input capacitance on the amplifier A3 because the amplifier A3 may be connected to, e.g., many comparators A1. Although two corresponding CDS circuit structures, e.g., 152, 154, are shown, embodiments of the invention may employ more than two corresponding CDS circuit structures. A number of corresponding CDS circuit structures employed may correspond to a number of devices, e.g., comparators A1, of the corresponding CDS array 130 being driven by the respective reference voltage generator 150.

Figure 9:
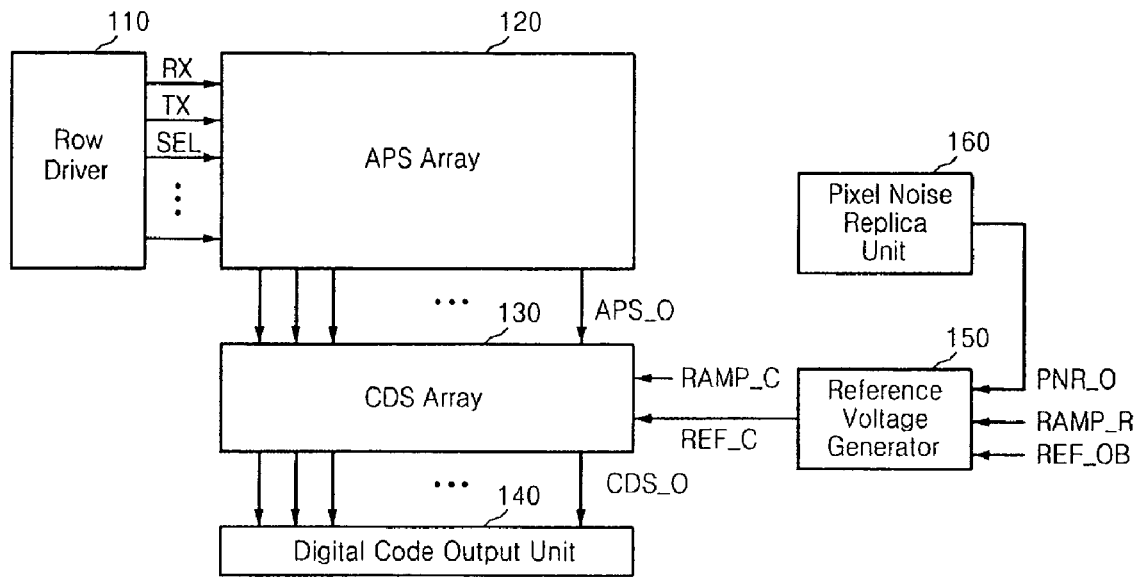
FIG. 9 illustrates a block diagram of a second exemplary embodiment of a CMOS image sensor employing one or more aspects of the invention.
Figure 10:
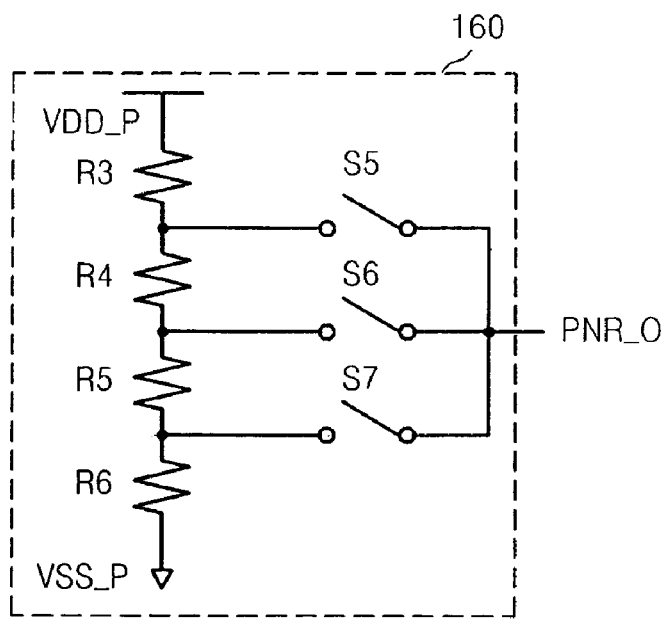
FIG. 10 illustrates a schematic diagram of an exemplary embodiment of a pixel noise replica unit according to one or more aspects of the invention.

FIG. 9 illustrates a block diagram of a second exemplary embodiment of a CMOS image sensor employing one or more aspects of the invention, and FIG. 10 illustrates a schematic diagram of an exemplary embodiment of a pixel noise replica unit according to one or more aspects of the invention. Only aspects of the exemplary embodiment that are different to the exemplary embodiments described above with relation to FIGS. 5-8 will be described below.

In the exemplary embodiment illustrated in FIG. 9, a pixel noise replication unit 160 is employed instead of the OB pixel array 122 of the CMOS image sensor 105. The pixel noise replication unit 160 may copy pixel noise, e.g., power supply noise, to an output signal PNR_O to be supplied to the reference voltage generator 150.

As shown in FIG. 10, the exemplary pixel noise replication unit 160 may include devices, e.g., resistors and switches, for scaling a voltage level of the pixel noise, e.g. power supply noise. The power supply voltage VDD_P and the ground power supply voltage VSS_P are supplied by the same voltage sources that are supplying, e.g., the APS array 120.

Exemplary embodiments of the present invention have been disclosed herein, and although specific terms are employed, they are used and are to be interpreted in a generic and descriptive sense only and not for purpose of limitation. While embodiments of the present invention have been described relative to a hardware implementation, the processing of present invention may be implemented in software, e.g., by an article of manufacture having a machine-accessible medium including data that, when accessed by a machine, cause the machine to generate a signal for reducing noise. Accordingly, it will be understood by those of ordinary skill in the art that various changes in form and details may be made without departing from the spirit and scope of the present invention as set forth in the following claims.

What is claimed is:

1. A column analog to digital conversion device, comprising:
   a reference voltage generator generating, in response to an optical black (OB) pixel output signal and a first ramp signal, a correlated double sampled OB sampling signal from the OB pixel output signal and generating a second reference voltage according to the OB sampling signal and a first reference voltage; and
   a correlated double sampling array generating, in response to an active pixel output signal and a second ramp signal, a correlated double sampled active sampling signal from the active pixel output signal and generating a comparison result signal for generating a digital code by comparing the active sampling signal and the second reference voltage, wherein the first ramp signal and the second ramp signal are generated by a same ramp signal generator, and the first ramp signal has an equal voltage level before and after a ramp operation start.

2. The device of claim 1, wherein the second reference voltage supplies the same type of noise as one supplied to the active sampling signal of the active pixel output signal.

3. The device of claim 2, wherein the noise included in the active sampling signal is a switching noise due to switching of a correlated double sampling operation, which is for generating a power supply to a pixel array and the active sampling signal.

4. The device of claim 2, wherein the first reference voltage is supplied as a reference voltage, which is not affected by the noise included in the active sampling signal.

5. The device of claim 1, wherein the reference voltage generator comprises:
   an OB correlated double sampling circuit for generating the OB sampling signal; and
   an amplifier generating the second reference voltage by buffering the OB sampling signal.

6. The device of claim 5, wherein the OB correlated double sampling circuit comprises:
   a first switch controlling transmission of the OB pixel output signal;
   a second switch controlling transmission of the first ramp signal;
   a blocking capacitor connected between an output of the first switch and an output of the second switch;
   a signal storage capacitor supplying the OB sampling signal by being connected to the output of the first switch; and a comparison unit receiving the OB sampling signal and comparing the OB sampling signal with the first reference voltage.

7. The device of claim 6, wherein the comparison unit includes a switch and a differential comparator which are connected in parallel, wherein the OB correlated double sampling circuit further includes a signal transmission capacitor connected to an output of the comparison unit, and a switch and an amplifier which are connected in parallel to an output of the signal transmission capacitor.

8. A column analog to digital conversion device, comprising:
　a pixel noise replication unit including a plurality of resistors connected in series between power supplies and supplying a pixel noise replica signal by scaling a voltage level of a pixel noise included in the power supplies;
　a reference voltage generator generating a replica sampling signal which is correlated double sampled from the pixel noise replica signal in response to the pixel noise replica signal and a first ramp signal and generating a second reference voltage based on the replica sampling signal and a first reference voltage; and
　a correlated double sampling array generating, in response to an active pixel output signal and a second ramp signal, an active sampling signal which is correlated double sampled by the active pixel output signal and generating a comparison result signal for generating a digital code by comparing the active sampling signal with the second reference voltage.

9. The column analog to digital conversion device of claim 8, wherein the power supplies are the same power supplies that supply power to an active pixel array outputting the active pixel output signal and the second reference voltage supplies the same type of noise as one supplied to the active sampling signal of the active pixel output signal.

10. The column analog to digital conversion device of claim 8, wherein the noise included in the active sampling signal is a switching noise due to switching of a correlated double sampling operation for generating the power supplies supplied to an active pixel array and the active sampling signal generation.

11. The column analog to digital conversion device of claim 8, wherein the pixel noise replication unit further comprises a plurality of switches that choose the pixel noise replica signal according to a scaling level,
　wherein the reference voltage generator comprises:
　　a replica correlated double sampling circuit for generating the replica sampling signal; and
　　an amplifier generating the second reference voltage by buffering the replica sampling signal.

12. The column analog to digital conversion device of claim 11, wherein the replica correlated double sampling circuit comprises:
　　a first switch controlling transmission of the pixel noise replica signal;
　a second switch controlling transmission of the first ramp signal;
　　a blocking capacitor connected between an output of the first switch and an output of the second switch;
　　a signal storage capacitor connected to the output of the first switch and supplies the replica sampling signal; and
　　a comparison unit receiving the replica sampling signal and comparing the replica sampling signal with the first reference voltage.

13. A column analog to digital conversion device, comprising:
　a reference voltage generator generating, in response to an optical black (OB) pixel output signal and a first ramp signal, a correlated double sampled OB sampling signal from the OB pixel output signal and generating a second reference voltage according to the OB sampling signal and a first reference voltage, wherein the reference voltage generator includes:
　　an OB correlated double sampling circuit for generating the OB sampling signal, and
　　an amplifier generating the second reference voltage by buffering the OB sampling signal, wherein the OB correlated double sampling circuit includes:
　　　a first switch controlling transmission of the OB pixel output signal;
　　　a second switch controlling transmission of the first ramp signal;
　　　a blocking capacitor connected between an output of the first switch and an output of the second switch;
　　　a signal storage capacitor supplying the OB sampling signal by being connected to the output of the first switch; and
　　　a comparison unit receiving the OB sampling signal and comparing the OB sampling signal with the first reference voltage; and
　a correlated double sampling array generating, in response to an active pixel output signal and a second ramp signal, a correlated double sampled active sampling signal from the active pixel output signal and generating a comparison result signal for generating a digital code by comparing the active sampling signal and the second reference voltage.

14. The device of claim 13, wherein the comparison unit includes a switch and a differential comparator which are connected in parallel, wherein the OB correlated double sampling circuit further includes a signal transmission capacitor connected to an output of the comparison unit, and a switch and an amplifier which are connected in parallel to an output of the signal transmission capacitor.

\* \* \* \* \*